United States Patent
Wang et al.

(10) Patent No.: US 11,348,954 B2
(45) Date of Patent: May 31, 2022

(54) TIME-RESOLVING SENSOR FOR RANGE MEASUREMENT AND 2D GREYSCALE IMAGING

(71) Applicant: Samsung Electronics Co., Ltd., Suwon-si (KR)

(72) Inventors: Yibing Michelle Wang, Temple City, CA (US); Lilong Shi, Austin, TX (US); Kwang Oh Kim, Cerritos, CA (US); Chunji Wang, Los Angeles, CA (US)

(73) Assignee: SAMSUNG ELECTRONICS CO., LTD.

(*) Notice: Subject to any disclaimer, the term of this patent is extended or adjusted under 35 U.S.C. 154(b) by 86 days.

(21) Appl. No.: 16/409,767

(22) Filed: May 10, 2019

(65) Prior Publication Data

US 2020/0303437 A1    Sep. 24, 2020

Related U.S. Application Data

(60) Provisional application No. 62/820,833, filed on Mar. 19, 2019.

(51) Int. Cl.
| | | |
|---|---|---|
| *H01L 27/146* | (2006.01) | |
| *G01S 17/10* | (2020.01) | |
| *G01S 17/894* | (2020.01) | |
| *G01S 7/4863* | (2020.01) | |
| *G01S 7/4865* | (2020.01) | |

(52) U.S. Cl.
CPC ...... *H01L 27/14609* (2013.01); *G01S 7/4863* (2013.01); *G01S 7/4865* (2013.01); *G01S 17/10* (2013.01); *G01S 17/894* (2020.01); *H01L 27/14643* (2013.01)

(58) Field of Classification Search
CPC ......... H01L 27/14609; H01L 27/14643; G01S 17/10; G01S 17/894; G01S 7/4865; G01S 7/4863

See application file for complete search history.

(56) References Cited

U.S. PATENT DOCUMENTS

| | | | |
|---|---|---|---|
| 9,639,063 B2 | 5/2017 | Dutton et al. | |
| 9,753,126 B2 | 9/2017 | Smits | |
| 10,191,154 B2 | 1/2019 | Kadambi et al. | |
| 2009/0021617 A1* | 1/2009 | Oggier | G01S 17/894 348/294 |
| 2010/0053405 A1* | 3/2010 | Lehmann | H01L 27/14609 348/311 |

(Continued)

*Primary Examiner* — Jennifer D Bennett
(74) *Attorney, Agent, or Firm* — Renaissance IP Law Group LLP

(57) ABSTRACT

A pixel of an image sensor includes a pinned photodiode (PPD), a switching device and an output circuit. A first terminal of the switching device is coupled to the PPD. A second terminal of the switching device is coupled to a floating diffusion (FD). A third terminal of the switching device is coupled to a first enable signal and a second enable signal. The switching device is responsive to the first enable signal to transfer a first charge on the PPD to the FD, and responsive to the second enable signal to transfer a second charge on the PPD to the FD. The output circuit outputs a first voltage based on the first charge and outputs a second voltage based on the second charge in which the first voltage corresponds to a time of flight of one or more detected photons and the second voltage corresponds to a greyscale image.

20 Claims, 8 Drawing Sheets

(56) References Cited

U.S. PATENT DOCUMENTS

2012/0261553 A1* 10/2012 Elkind ................. H04N 5/3745
                                                           250/208.1
2018/0331139 A1   11/2018 Genov et al.
2018/0338127 A1* 11/2018 Wang ..................... G01S 17/89

* cited by examiner

TIME-RESOLVING SENSOR FOR RANGE MEASUREMENT AND 2D GREYSCALE IMAGING

CROSS-REFERENCE TO RELATED APPLICATION

This patent application claims the priority benefit under 35 U.S.C. § 119(e) of U.S. Provisional Patent Application No. 62/820,833, filed on Mar. 19, 2019, the disclosure of which is incorporated herein by reference in its entirety.

TECHNICAL FIELD

The subject matter disclosed herein generally relates to an apparatus and a method for range measurement and a greyscale intensity measurement and, more particularly, to an apparatus and a method for direct time-of-flight (TOF) range measurement and a greyscale intensity measurement in the same pixel of an image sensory array.

BACKGROUND

Existing single-photo single-photon avalanche diode (SPAD) sensors for Light Detection and Ranging (LiDAR) have a low spatial resolution, a low fill factor and a high power consumption if a time-to-digital counter (TDC) is placed inside each pixel of a sensor array. If a single-ended time-to-analog converter (TAC) is used instead of a TDC, then a low range accuracy results. Additionally, existing SPAD sensors do not provide an intensity imaging capability together with range information.

SUMMARY

An example embodiment provides a pixel of an image sensor that may include a pinned photodiode (PPD), a switching device, and an output circuit. The PPD may have a first terminal and a second terminal in which the second terminal may be coupled to a ground voltage. The switching device may have first, second and third terminals in which the first terminal may be coupled to the first terminal of the PPD, the second terminal may be coupled to a floating diffusion, and the third terminal may be coupled to a first enable signal and a second enable signal. The switching device may be responsive to the first enable signal to transfer a first charge on the PPD to the floating diffusion, and may be responsive to the second enable signal to transfer a second charge on the PPD to the floating diffusion, the second enable signal being subsequent to the first enable signal. The output circuit may output a first voltage that is based on the first charge on the floating diffusion and may output a second voltage that is based on the second charge on the floating diffusion in which the first voltage may correspond to a time of flight of one or more detected photons and the second voltage may correspond to a greyscale image.

Another example embodiment provides an image sensor that may include an array of a plurality of pixels. At least one pixel of the array of pixel may include a pinned photodiode (PPD), a switching device, and an output circuit. The PPD may have a first terminal and a second terminal in which the second terminal may be coupled to a ground voltage. The switching device may have first, second and third terminals in which the first terminal may be coupled to the first terminal of the PPD, the second terminal may be coupled to a floating diffusion, and the third terminal may be coupled to a first enable signal and a second enable signal. The switching device may be responsive to the first enable signal to transfer a first charge on the PPD to the floating diffusion, and may be responsive to the second enable signal to transfer a second charge on the PPD to the floating diffusion, the second enable signal being subsequent to the first enable signal. The output circuit may output a first voltage that is based on the first charge on the floating diffusion and may output a second voltage that is based on the second charge on the floating diffusion in which the first voltage may correspond to a time of flight of one or more detected photons and the second voltage may correspond to a greyscale image.

Still another example embodiment provides an image sensor that may include an array of pixels. At least one pixel of the array of pixels may include a capacitive device, a switching device, and an output circuit. The switching device may be responsive to a first enable signal to transfer a first charge on the capacitive device to a floating diffusion, and may be responsive to a second enable signal to transfer a second charge on the capacitive device to the floating diffusion in which the second enable signal may be subsequent to the first enable signal. The output circuit may output a first voltage that is based on the first charge on the floating diffusion and may output a second voltage that is based on the second charge on the floating diffusion in which the first voltage may correspond to a time of flight of one or more detected photons and the second voltage may correspond to a greyscale image.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1:
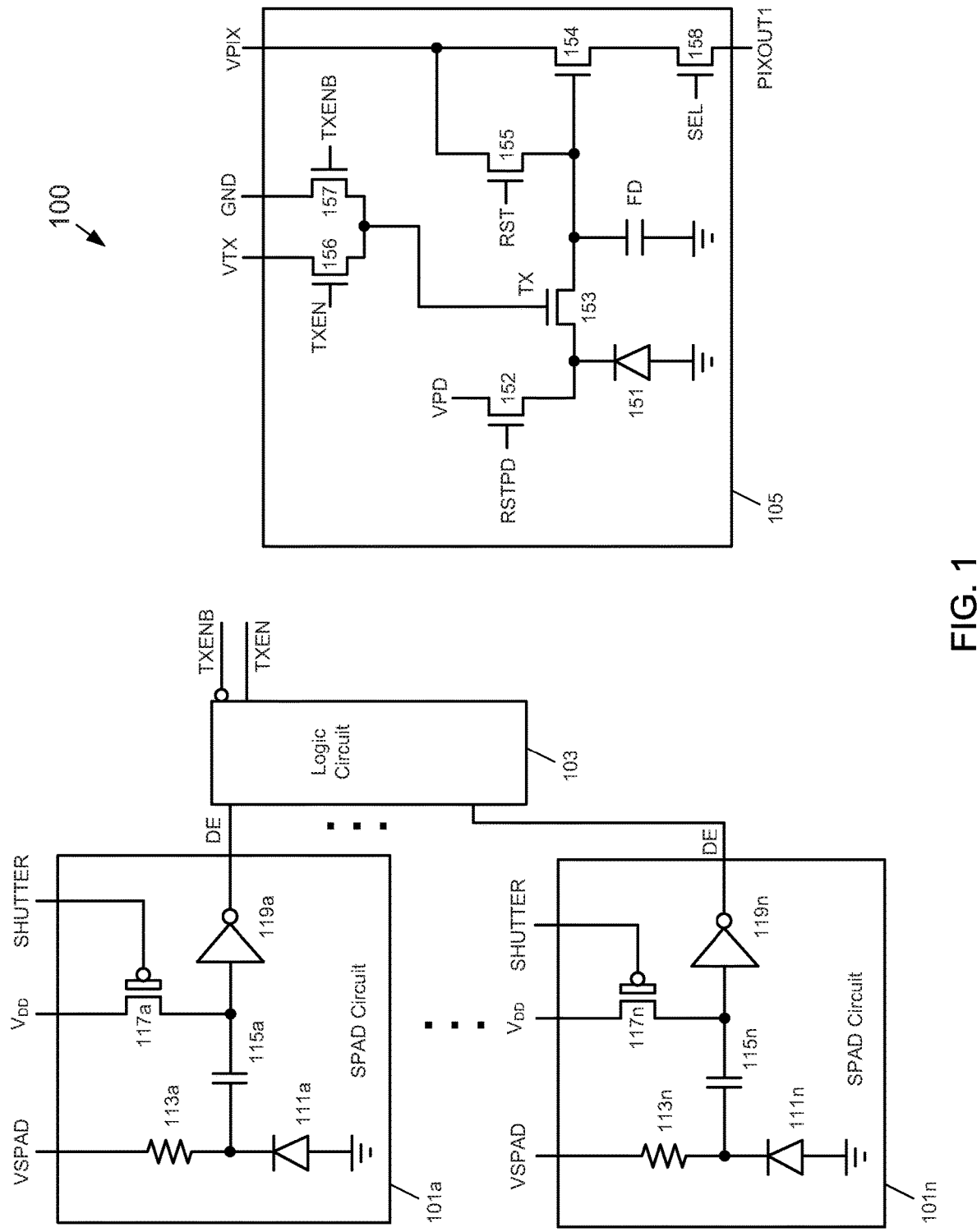
FIG. 1 depicts a block diagram of an example embodiment of a pixel that generates a ranging measurement output and a greyscale 2D image output according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosures of U.S. patent application Ser. No. 15/878,392, filed Jan. 23, 2018, entitled "Time-Resolving Sensor Using SPAD+PPD or Capacitors in Pixel For Range Measurement," and Ser. No. 16/140,529, filed Sep. 24, 2018, entitled "Time-Resolving Image Sensor for Range Measurement and 2D Greyscale Imaging," are incorporated by reference in their entirety.

One example embodiment of the subject matter disclosed herein may be used to provide improved vision for drivers under difficult conditions, such as, but not limited to, low light, bad weather, or strong ambient light, and provides an improvement to the performance of an autonomous navigation system by combining a single-photon avalanche diode (SPAD) circuit, a logic circuit, and a pinned photodiode (PPD) circuit in a pixel of an time-of-flight system. Such a system may provide range measurements that are based on a controlled charge transferring, photon counting and a single-ended-to-differential time-to charge conversion. In one embodiment, the PPD circuit may include more than one transfer gate and more than one storage node. The PPD circuit also outputs a greyscale intensity image. Because the same PPD circuit captures the range information and the greyscale intensity information, no image fusion of the two images is needed because both images are aligned.

In one embodiment, each pixel of an array of pixels of a LiDAR image sensor includes a SPAD and PPD-based time-to-charge converter (TCC). Three-dimensional (3D) TOF information may be obtained using a synchronized laser source. After the synchronized laser source has been flashed, TOF information stored at a floating diffusion (FD) node of a PPD circuit in each pixel of an array of pixels is read out in, for example, a raster-scan manner. While the TOF information is being read out, the PPD may be reset and is then used to integrate ambient light to capture a two-dimensional (2D) image for a low ambient-light environment. The 2D integrated ambient light signal detected by the PPD may be transferred to the FD node for read out after the TOF information has been read out from the FD. In one embodiment, a second transfer gate and a second FD node may be used for the 2D image readout instead of sharing the same output path that is used by the TOF information readout. In another embodiment, a capacitor-based TCC circuit may be used for TOF information, and a separate PPD circuit may be used for 2D image information. This example embodiment uses separate output paths for the 3D and the 2D image data.

FIG. 1 depicts a block diagram of an example embodiment of a pixel 100 that generates a ranging measurement output and a greyscale 2D image output according to the subject matter disclosed herein. The pixel 100 may be one of a plurality of other similar pixels in an image array (not shown). The pixel 100 may include one or more SPAD circuits 101a-101n, a logic circuit 103, and a PPD circuit 105.

In one embodiment, each of the one or more SPAD circuits 101 may include a SPAD 111, a resistor 113, a capacitor 115, a p-type MOSFET transistor 117 and a buffer 119. The SPAD 111 may include an anode connected to a ground potential, and a cathode. The resistor 113 may include a first terminal for receiving a VS PAD voltage and a second terminal connected to the cathode of the SPAD 111. In another embodiment, the positions of the SPAD 111 and the resistor 113 may be swapped. The SPAD 111 may respond to a photon. In response to receiving a photon, the SPAD 111 outputs a pulse signal that goes rapidly from the VSPAD voltage to below a breakdown voltage of the SPAD 111, and then more gradually returns to the VSPAD voltage.

The capacitor 115 may include a first terminal connected to the cathode of the SPAD 111 and a second terminal. In an alternative embodiment, the capacitor 115 may be omitted. The p-type MOSFET 117 may include a first S/D terminal connected to the second terminal of the capacitor 115, a gate for receiving a SHUTTER signal, and a second S/D terminal for receiving a VPIX voltage ($V_{DD}$). The buffer 119 may include an input connected to the second terminal of the capacitor 115, and an inverting output, which may output a DE signal corresponding to the output of the SPAD circuit 101. In an alternative embodiment, the buffer 117 may be noninverting.

The logic circuit 103 may include inputs connected to the DE signal of each of the one or more SPAD circuit 101a-101n, and outputs a TXEN signal and a TXENB signal, which may be an inversion of the TXEN signal.

The PPD circuit 105 may include a pinned photo diode (PPD) 151, a first transistor 152, a second transistor 153, a third transistor 154, a fourth transistor 155, a fifth transistor 156, a sixth transistor 157, and a seventh transistor 158.

The PPD 151 may be exposed to light and may include a first terminal connected to a ground potential, and a second terminal. The PPD 151 may store a charge in a manner that is similar to a capacitor and in some cases be referred to as a capacitive device.

The first transistor 152 may include a gate terminal connected to an RSTPD signal, a first S/D terminal connected to a VPD potential, and a second S/D terminal connected to the second terminal of the PPD 151.

The second transistor 153 may include a gate terminal connected to a TX signal, a first S/D terminal connected to a floating diffusion FD node, and a second S/D terminal connected to the second S/D terminal of the first transistor 152 and the second terminal of the PPD 151. The floating diffusion FD node is represented in FIG. 1 with a capacitor symbol. There may be a parasitic capacitance between the FD node and ground, which is not indicated in FIG. 1. In one embodiment, a physical capacitance may also be connected between the FD node and ground.

The third transistor 154 may include a gate terminal connected to the FD node and the first S/D terminal of the second transistor 153, a first S/D terminal connected to a VPIX voltage, and a second S/D terminal. The third transistor 154 may operate to convert a charge on the FD node to a voltage at the second S/D terminal of the third transistor 154. The fourth transistor 155 may include a gate terminal connected to a RST signal, a first S/D terminal connected to the VPIX voltage, and a second S/D terminal connected to the first S/D terminal of the first transistor 152 and the FD node.

The fifth transistor 156 may include a gate terminal connected to the TXEN signal, a first S/D terminal connected to a VTX signal, and a second S/D terminal connected to the gate terminal of the second transistor 153. The sixth transistor 157 may include a gate terminal connected to the TXENB signal, a first S/D terminal connected to a ground potential, and a second S/D terminal connected to the gate terminal of the second transistor 153 and the second S/D terminal of the fifth transistor 156. The seventh transistor 158 may include a gate terminal connected to an SEL signal, a first S/D terminal connected to the second S/D terminal of the third transistor 154, and a second S/D terminal connected to a pixel output line PIXOUT1.

Figure 2:
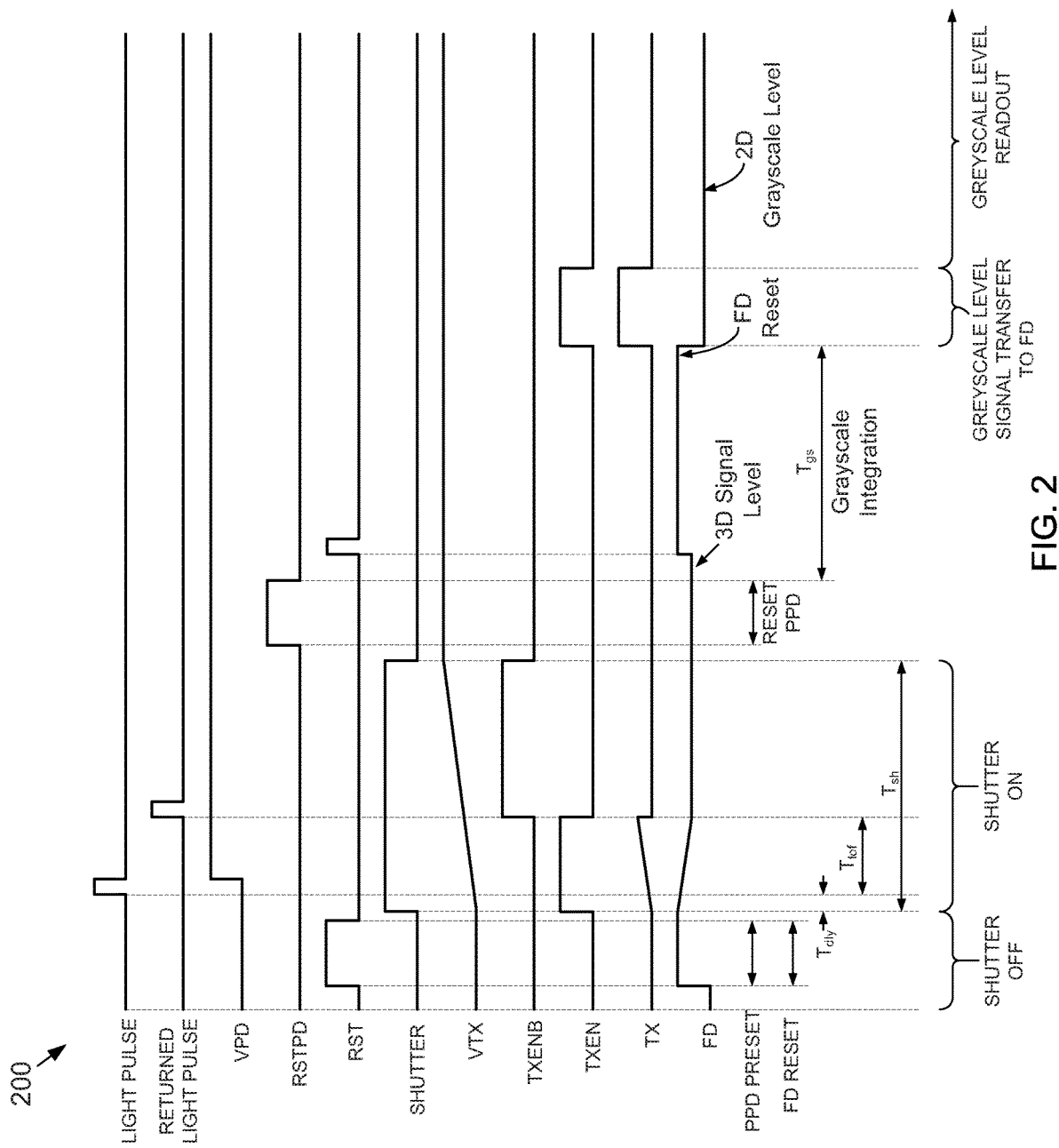
FIG. 2 depicts an example relative signal timing diagram for the pixel of FIG. 1 that generates a ranging measurement and a greyscale 2D image according to the subject matter disclosed herein.

FIG. 2 depicts an example relative signal timing diagram 200 for the pixel 100 that generates a ranging measurement and a greyscale 2D image according to the subject matter disclosed herein. Initially, the RST signal also goes high, which allows the fourth transistor 155 to conduct the VPIX voltage to the FD node, resetting the FD node. The PPD 151 is reset to 0V.

After the SHUTTER signal goes high, a light pulse is transmitted a delay of $T_{dly}$ later. When the SHUTTER signal is active high, the TXEN signal is active and the VTX signal is passed through the fifth transistor 156, thereby making TX signal active. The TX signal modulates the voltage applied to the gate of the second transistor 153 to make the charge that is transferred from the PPD to the floating diffusion FD node a function of time. When a detection event DE occurs, the TXEN signal becomes inactive and the TX signal also become inactive. The time between when the light pulse is transmitted and the detection event DE is the time of flight $T_{tof}$. The charge that was being transferred from the PPD 151 to the FD node stops. When the TXENB signal becomes active, a ground voltage is connected to the gate of the second transistor 153.

When the SHUTTER signal ends, the TX signal becomes inactive and the voltage associated with the charge level on the FD node corresponds to the $T_{tof}$ of the light pulse, which may be read out from the PIXOUT1 output line. The time the SHUTTER signal is active is $T_{sh}$. The voltage corresponding to the charge level for the time-of-flight is output from the PIXOUT 1 output line. Variations in the slope of the VTX signal from pixel to pixel do not cause range measurement errors as long as the second transistor 153 operates in a linear mode during an active SHUTTER signal.

After the $T_{tof}$ voltage has been read out from the PIXOUT1 output line, the RSTPD signal goes high, resetting the charge on the PPD 151 to be high (3 V). The RST signal also goes high resetting the charge level on the FD node. The TXEN signal goes high a greyscale-integration time $T_{gs}$ after the PPD 151 has been reset causing the charge level on the PPD 151, which has been integrating the received light during the integration time $T_{gs}$, to be transferred to the FD node. The charge on the FD node corresponds to a greyscale image intensity received at the pixel, which may be read out from the PIXOUT1 output line as a regular 2D sensor.

Figure 3:
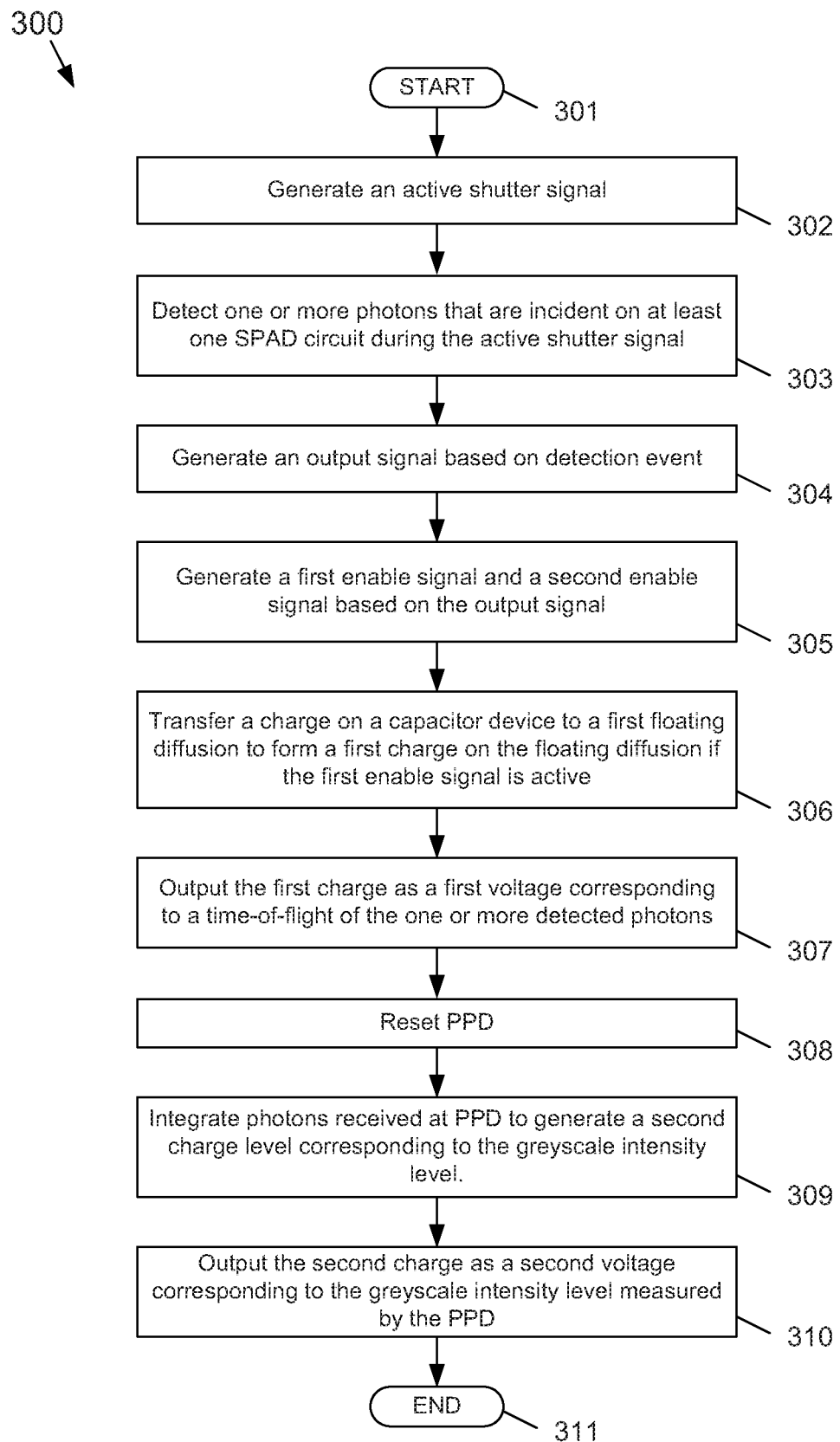
FIG. 3 depicts a flow diagram of a method to operate a pixel to generate a ranging measurement and a greyscale 2D image according to the subject matter disclosed herein.

FIG. 3 depicts a flow diagram of a method 300 to operate a pixel to generate a ranging measurement and a greyscale 2D image according to the subject matter disclosed herein. The method starts at 301. At 302, an active shutter signal is generated. At 303, one or more photons that are incident on at least one SPAD circuit 101 are detected (a detection event DE) during the active shutter signal in which the one or more detected photons have been reflected from an object. At 304, an output signal is generated based on the detection event DE. At 305, a first enable signal TXEN and a second enable signal TXENB are generated based on the output signal for the detection event DE. In one embodiment, the first enable signal becomes active in response to a beginning of the active shutter signal and becomes inactive in response to the output signal, and the second enable signal becomes active in response to the output signal and becomes inactive in response to an end of the active shutter signal.

At 306, a charge on a capacitor device SC is transferred to a floating diffusion FD node to form a first charge on the floating diffusion FD node based on the first enable signal being active. At 307, the first charge is output on the PIXOUT output line as a voltage corresponding to a time-of-flight of the one or more detected photons. At 308, the PPD 151 is reset. At 309, the ambient light received by the PPD 151 is integrated for a greyscale-integration time $T_{gs}$ to generate a second charge level on the PPD 151 that corresponds to the greyscale intensity of the image received at the pixel. At 310, the second charge level is transferred to the floating diffusion FD and output on the PIXOUT output line as a voltage corresponding to the greyscale intensity of the image received at the pixel. The method ends at 311.

Figure 4:
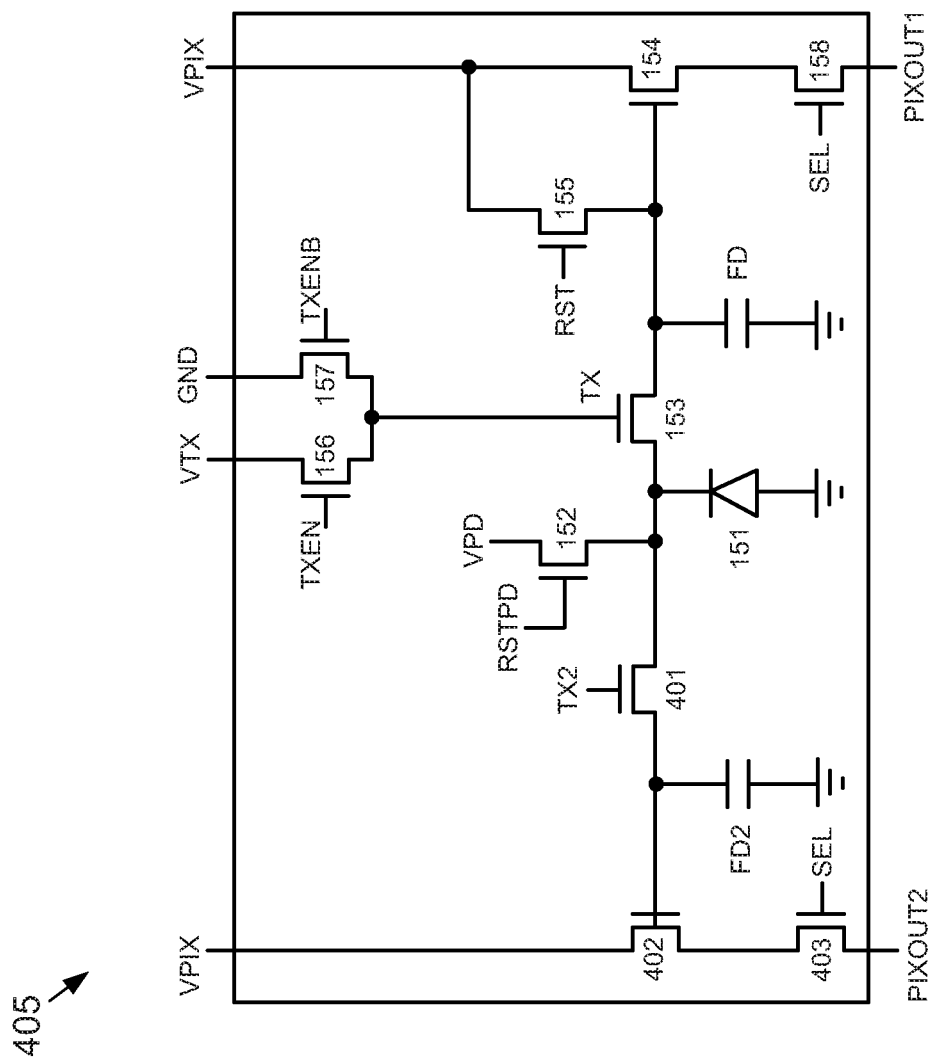
FIG. 4 depicts a block diagram of a second example embodiment of a PPD circuit that generates a ranging measurement and a greyscale 2D image according to the subject matter disclosed herein.

FIG. 4 depicts a block diagram of a second example embodiment of a PPD circuit 405 that generates a ranging measurement and a greyscale 2D image according to the subject matter disclosed herein. The PPD circuit 405 differs from the PPD circuit 105 of FIG. 1 by including a separate path for reading out the greyscale intensity value. Rather than being output from the PIXOUT1 output line, the greyscale intensity value is output through a separate PIXOUT2 output line. Also, a TX2 signal, which is applied to the gate of a transistor 401, goes high to transfer the greyscale charge level on the PPD 151, which has been integrating the received light during the integration time $T_{gs}$, to a second floating diffusion FD2 node. The second floating diffusion FD2 node is represented in FIG. 4 with a capacitor symbol. The charge on the second floating diffusion FD2 node corresponds to a greyscale image intensity received at the pixel, which may be read out from the PIXOUT2 output line using transistors 402 and 403. Operation of the PPD circuit 405 is similar to the timing diagram shown in FIG. 2.

Figure 5:
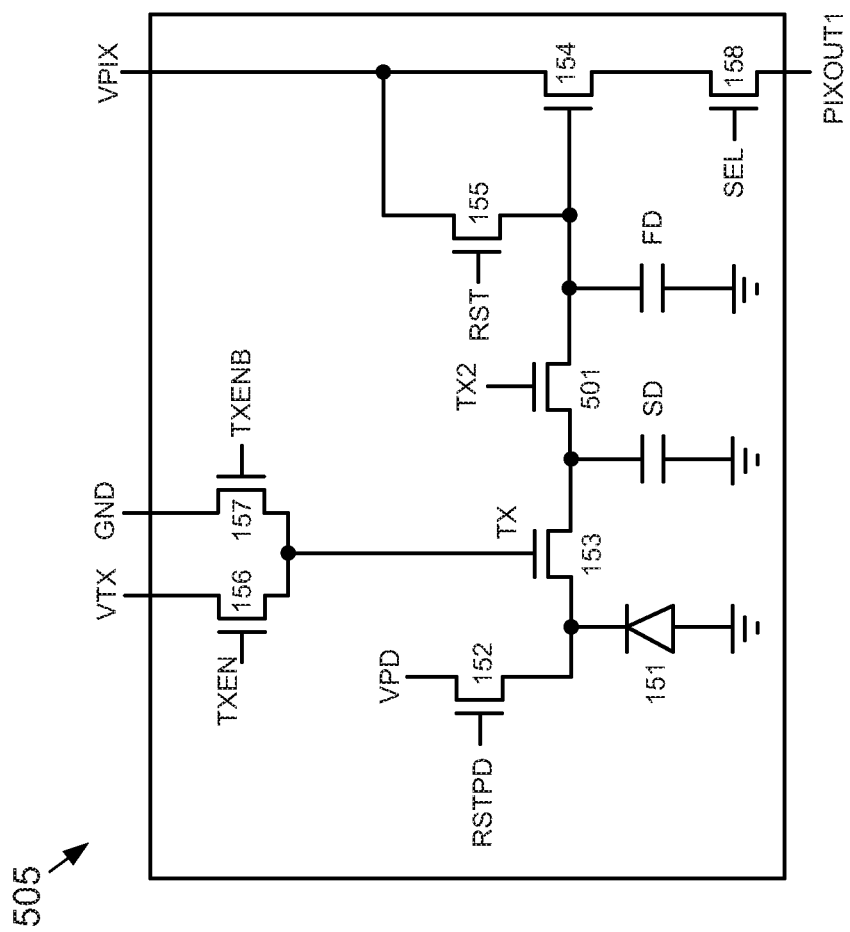
FIG. 5 depicts a third example embodiment of a PPD circuit that generates a ranging measurement and a greyscale 2D image according to the subject matter disclosed herein.
Figure 6:
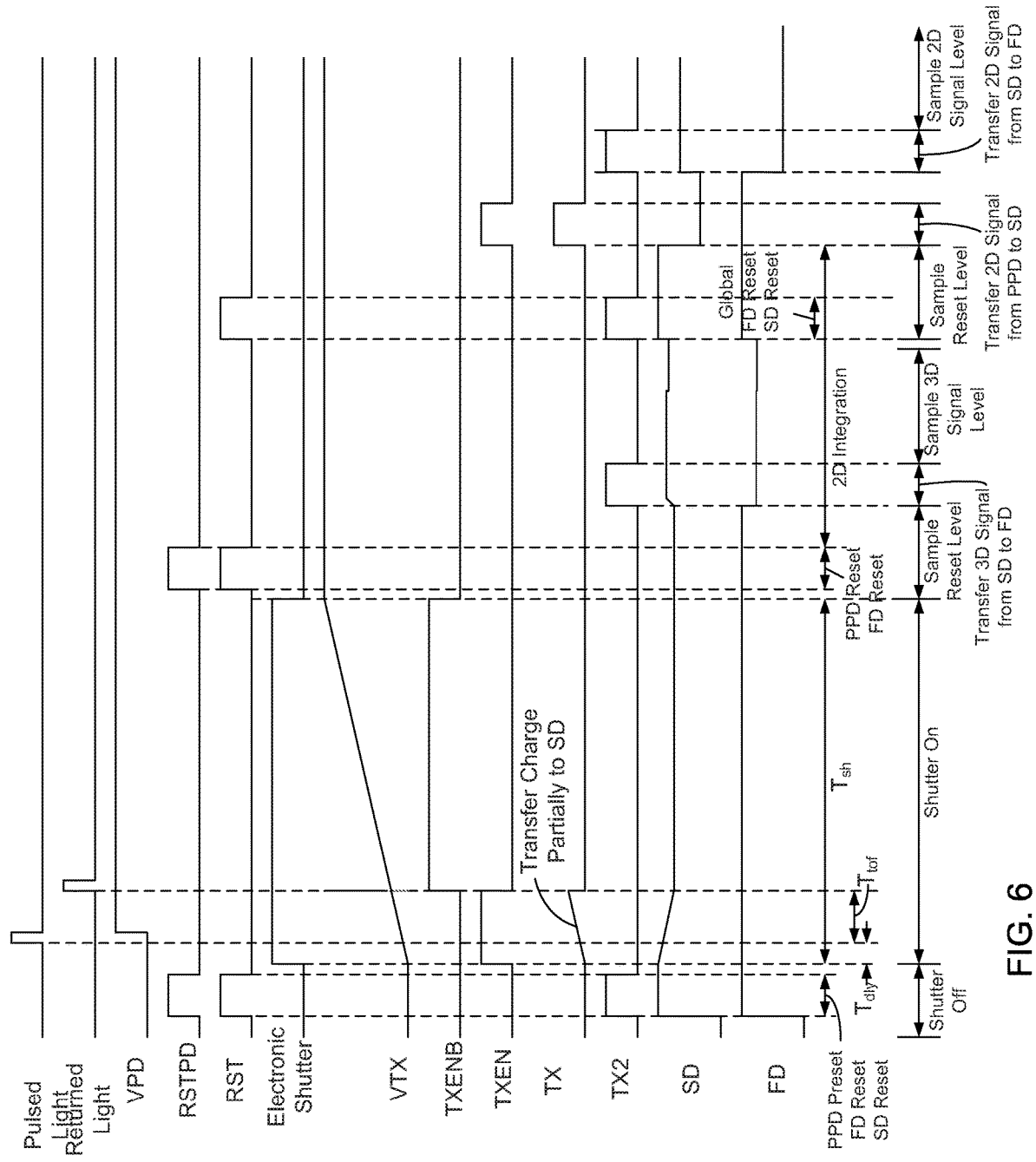
FIG. 6 shows an example relative signal timing diagram for the PPD circuit of FIG. 5 that generates a ranging measurement and a greyscale 2D image according to the subject matter disclosed herein.

FIG. 5 depicts a third example embodiment of a PPD circuit 505 that generates a ranging measurement and a greyscale 2D image according to the subject matter disclosed herein. The PPD circuit 505 differs from the PPD circuit 105 of FIG. 1 by including a storage diffusion SD node and a transistor 501. FIG. 6 shows an example relative signal timing diagram 600 for the PPD circuit 500 that generates a ranging measurement and a greyscale 2D image according to the subject matter disclosed herein.

Figure 7:
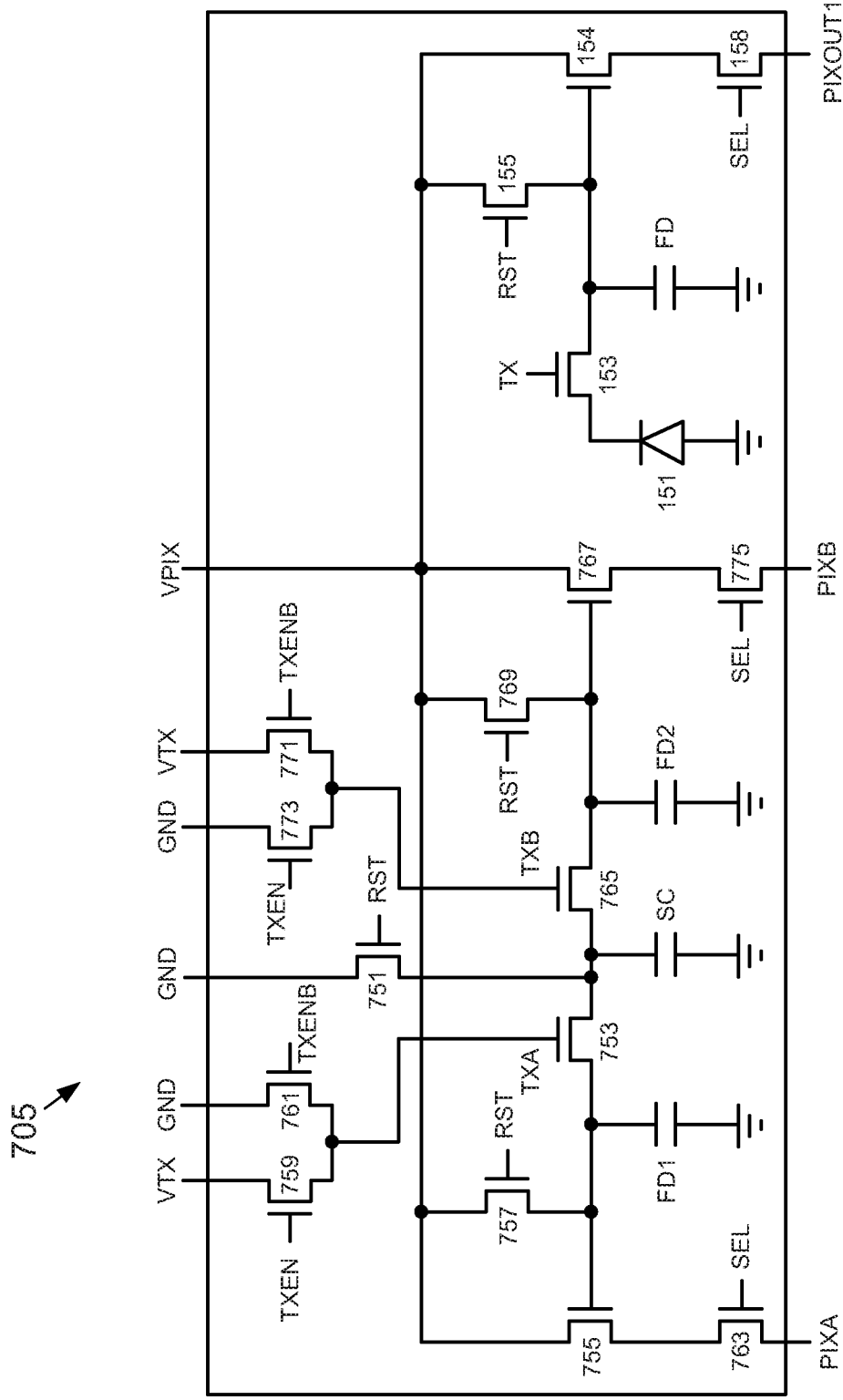
FIG. 7 depicts a fourth example embodiment of a PPD circuit that generates a ranging measurement and a greyscale 2D image according to the subject matter disclosed herein.

FIG. 7 depicts a fourth example embodiment of a PPD circuit 705 that generates a ranging measurement and a greyscale 2D image according to the subject matter disclosed herein. The fourth PPD circuit 705 may include a capacitor device SC, a first transistor 751, a second transistor 753, a third transistor 755, a fourth transistor 757, a fifth transistor 759, a sixth transistor 761, a seventh transistor 763, an eighth transistor 765, a ninth transistor 767, a tenth transistor 769, an eleventh transistor 771, a twelfth transistor 773, and a thirteenth transistor 775.

The capacitor device SC may include a first terminal connected to a ground potential, and a second terminal. The capacitor device SC may store a charge in a manner that is similar to a capacitor. In one embodiment, the capacitor device may be a capacitor. In another embodiment, the capacitor device may be a PPD that may be covered so that it does not respond to light. In either embodiment, the capacitor device SC may be used as part of a time-to-charge converter.

The first transistor 751 may include a gate terminal connected to an RST signal, a first S/D terminal connected to a ground potential, and a second S/D terminal connected to the second terminal of the capacitor device SC. The second transistor 753 may include a gate terminal connected to a TXA signal, a first S/D terminal connected to a first floating diffusion FD1 node, and a second S/D terminal connected to the second S/D terminal of the first transistor 751 and the second terminal of the capacitor device SC. The first floating diffusion FD1 node is represented in FIG. 7 with a capacitor symbol. There may be a parasitic capacitance between the FD1 node and ground, which is not indicated in FIG. 7. In one embodiment, a physical capacitance may also be connected between the FD1 node and ground.

The third transistor 755 may include a gate terminal connected to the FD1 node and the first S/D terminal of the second transistor 753, a first S/D terminal connected to a VPIX voltage, and a second S/D terminal. The third transistor 755 may operate to convert a charge on the FD1 node to a voltage at the second S/D terminal of the third transistor 755. The fourth transistor 757 may include a gate terminal connected to the RST signal, a first S/D terminal connected to the VPIX voltage, and a second S/D terminal connected to the second S/D terminal of the first transistor 751 and the second terminal of the capacitor device SC.

The fifth transistor 759 may include a gate terminal connected to the TXEN signal, a first S/D terminal connected to a VTX signal, and a second S/D terminal connected to the gate terminal of the second transistor 753. The sixth transistor 761 may include a gate terminal connected to the TXENB signal, a first S/D terminal connected to a ground potential, and a second S/D terminal connected to the gate terminal of the second transistor 753 and the second S/D terminal of the fifth transistor 759.

The seventh transistor 763 may include a gate terminal connected to an SEL signal, a first S/D terminal connected to the second S/D terminal of the third transistor 755, and a second S/D terminal connected to a pixel output line PIXA. The eighth transistor 765 may include a gate terminal connected to a TXB signal, a first S/D terminal connected to a second floating diffusion FD2 node, and a second S/D terminal connected to the second S/D terminal of the first transistor 751, the second terminal of the capacitor device SC, and the second S/D terminal of the second transistor 753. The second floating diffusion FD2 node is represented in FIG. 7 with a capacitor symbol. There may be a parasitic capacitance between the FD2 node and ground, which is not indicated in FIG. 7. In one embodiment, a physical capacitance may also be connected between the FD2 node and ground.

The ninth transistor 767 may include a gate terminal connected to the FD2 node and the first S/D terminal of the eighth transistor 765, a first S/D terminal connected to the VPIX voltage, and a second S/D terminal. The ninth transistor 767 may operate to convert a charge on the FD1 node to a voltage at the second S/D terminal of the ninth transistor 767. The tenth transistor 769 may include a gate terminal connected to the RST signal, a first S/D terminal connected to the VPIX voltage, and a second S/D terminal connected to the second S/D terminal of the first transistor 751, the second terminal of the capacitor device SC, and the second S/D terminal of the eighth transistor 765.

The eleventh transistor 771 may include a gate terminal connected to the TXENB signal, a first S/D terminal connected to the VTX signal, and a second S/D terminal connected to the gate terminal of the eighth transistor 765. The twelfth transistor 773 may include a gate terminal connected to the TXEN signal, a first S/D terminal connected to a ground potential, and a second S/D terminal connected to the gate terminal of the eighth transistor 765 and the second S/D terminal of the eleventh transistor 771. The thirteenth transistor 765 may include a gate terminal connected to the SEL signal, a first S/D terminal connected to the second S/D terminal of the ninth transistor 767, and a second S/D terminal connected to a pixel output line PIXB.

The PPD circuit 705 also includes a separate PPD for the greyscale intensity measurement. That is, the PPD circuit 705 may also include most of the components of the PPD circuit 105 in FIG. 1, and operates in a similar manner to measure a greyscale intensity. The PPD 151 of the PPD circuit 705 is separate from the capacitor device SC.

Figure 8:
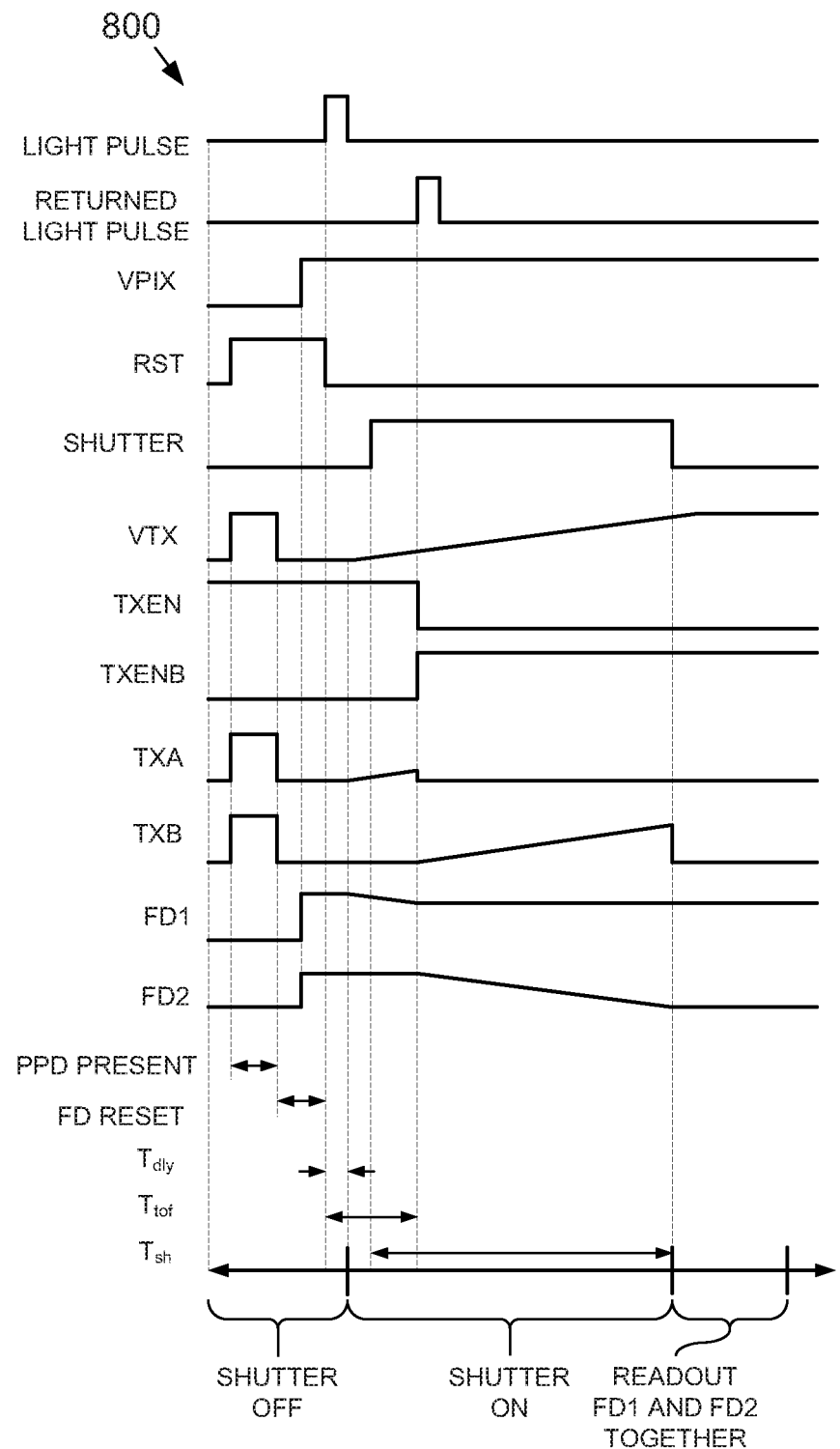
FIG. 8 depicts an example relative signal timing diagram for the operation of time-of-flight portion of the PPD circuit of FIG. 7 according to the subject matter disclosed herein.

FIG. 8 depicts an example relative signal timing diagram 800 for the operation of time-of-flight portion of the PPD circuit 700 according to the subject matter disclosed herein. In the signal timing diagram of FIG. 8, the TXENB signal is an inversion of the TXEN signal. When the SHUTTER signal is active high, the TXEN signal is active and the VTX signal is passed through the fifth transistor 759, thereby making the TXA signal is active. The charge on the capacitor device SC is transferred through the second transistor 753 to the FD1 node. Meanwhile, the ground potential is passed through the twelfth transistor 773, which makes the TXB signal inactive.

When a detection event DE occurs, the TXEN signal becomes inactive and the TXENB signal becomes active. When the TXEN signal becomes inactive, the TXA signal also become inactive and charge is stopped from being transferred through the second transistor 753 from the capacitor device SC to the FD1 node. When the TXENB signal becomes active, the TXB signal becomes active and charge is transferred from the capacitor device SC through the eighth transistor 765 to the FD2 node.

When the SHUTTER signal ends, the TXB signal becomes inactive and charge is stopped from being transferred through the eighth transistor 765 from the capacitor device SC to the FD2 node. The respective voltages associated with the charges on the FD1 node and the FD2 node are read out from the PIXA and PIXB output lines.

It should be noted that variations in the slope of the VTX signal and variations in the capacitance of the capacitor device SC from pixel to pixel do not cause range measurement errors, as long as the second transistor 753 (TXA) and the eighth transistor 765 (TXB) operate in a linear mode during an active SHUTTER signal.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A pixel of an image sensor, comprising:
   a pinned photodiode (PPD) having a first terminal and a second terminal, the second terminal being coupled to a ground voltage;
   a switching device having first, second and third terminals, the first terminal of the switching device being coupled to the first terminal of the PPD, the second terminal of the switching device being coupled to a floating diffusion, and the third terminal of the switching device being coupled to a first enable signal and a second enable signal, the switching device being responsive to the first enable signal to transfer a first charge on the PPD to the floating diffusion, and responsive to the second enable signal to transfer a second charge on the PPD to the floating diffusion, the second enable signal being subsequent to the first enable signal; and
   an output circuit that outputs a first voltage that is based on the first charge on the floating diffusion and that outputs a second voltage that is based on the second charge on the floating diffusion, the first voltage corresponding to a time of flight of one or more detected photons and the second voltage corresponding to a greyscale image.

2. The pixel of claim 1, further comprising:
   at least one single-photon avalanche diode (SPAD), each SPAD being responsive to during an active shutter signal to generate an output signal based on detecting the one or more photons that are incident on the SPAD, the one or more photons being reflected from an object; and
   a logic circuit coupled to the output signal of the at least one SPAD, the logic circuit to generate the first enable signal, the first enable signal being active in response to a beginning of the active shutter signal and being inactive in response to the output signal of the at least one SPAD.

3. The pixel of claim 1, wherein the output circuit outputs the first voltage and the second voltage through a same signal path.

4. The pixel of claim 3, wherein the floating diffusion comprises a first floating diffusion,
   the pixel further comprising a storage floating diffusion between the second terminal of the PPD and the first floating diffusion.

5. The pixel of claim 1, wherein the output circuit comprises a first signal path to output the first voltage and a second signal path to output the second voltage.

6. The pixel of claim 5, wherein the switching device comprises a first transistor and a second transistor, and the floating diffusion comprises a first floating diffusion and a second floating diffusion, and
   wherein the first transistor is responsive to the first enable signal to transfer the first charge on the PPD to the first floating diffusion, and
   wherein the second transistor comprises first, second and third terminals, the first terminal of the second transistor being coupled to the first terminal of the PPD, the second terminal of the second transistor being coupled to the second floating diffusion, and the third terminal of the second transistor being coupled to the second enable signal, the second transistor being responsive to the second enable signal to transfer the second charge on the PPD to the second floating diffusion.

7. An image sensor, comprising:
   an array of a plurality of pixels, at least one pixel comprising:
   a pinned photodiode (PPD);
   a switching device that is responsive to a first enable signal to transfer a first charge on the PPD to a floating diffusion, and responsive to a second enable signal to transfer a second charge on the PPD to the floating diffusion, the second enable signal being subsequent to the first enable signal; and
   an output circuit that outputs a first voltage that is based on the first charge on the floating diffusion and that outputs a second voltage that is based on the second charge on the floating diffusion, the first voltage corresponding to a time of flight of one or more detected photons and the second voltage corresponding to a greyscale image.

8. The image sensor of claim 7, wherein the PPD comprises a first terminal and a second terminal, the second terminal being coupled to a ground voltage, and
   wherein the switching device comprises first, second and third terminals, the first terminal of the switching device being coupled to the first terminal of the PPD, the second terminal of the switching device being coupled to the floating diffusion, and the third terminal of the switching device being coupled to the first enable signal and the second enable signal, the switching device being responsive to the first enable signal to transfer the first charge on the PPD to the floating diffusion, and responsive to the second enable signal to transfer the second charge on the PPD to the floating diffusion.

9. The image sensor of claim 8, further comprising:
at least one single-photon avalanche diode (SPAD), each SPAD being responsive to during an active shutter signal to generate an output signal based on detecting the one or more photons that are incident on the SPAD, the one or more photons being reflected from an object; and
a logic circuit coupled to the output signal of the at least one SPAD, the logic circuit to generate the first enable signal, the first enable signal being active in response to a beginning of the active shutter signal and being inactive in response to the output signal of the at least one SPAD.

10. The image sensor of claim 8, wherein the output circuit outputs the first voltage and the second voltage through a same signal path.

11. The image sensor of claim 10, wherein the floating diffusion comprises a first floating diffusion,
the at least one pixel further comprising a storage floating diffusion between the second terminal of the PPD and the first floating diffusion.

12. The image sensor of claim 7, wherein the output circuit comprises a first signal path to output the first voltage and a second signal path to output the second voltage.

13. The image sensor of claim 12, wherein the switching device comprises a first transistor and a second transistor, and the floating diffusion comprises a first floating diffusion and a second floating diffusion, and
wherein the first transistor is responsive to the first enable signal to transfer the first charge on the PPD to the first floating diffusion, and
wherein the second transistor comprises first, second and third terminals, the first terminal of the second transistor being coupled to the first terminal of the PPD, the second terminal of the second transistor being coupled to the second floating diffusion, and the third terminal of the second transistor being coupled to the second enable signal, the second transistor being responsive to the second enable signal to transfer the second charge on the PPD to the second floating diffusion.

14. An image sensor, comprising:
an array of a plurality of pixels, at least one pixel comprising:
a capacitive device;
a switching device that is responsive to a first enable signal to transfer a first charge on the capacitive device to a floating diffusion, and responsive to a second enable signal to transfer a second charge on the capacitive device to the floating diffusion, the second enable signal being subsequent to the first enable signal; and
an output circuit that outputs a first voltage that is based on the first charge on the floating diffusion and that outputs a second voltage that is based on the second charge on the floating diffusion, the first voltage corresponding to a time of flight of one or more detected photons and the second voltage corresponding to a greyscale image.

15. The image sensor of claim 14, wherein the capacitive device comprises a first terminal and a second terminal, the second terminal being coupled to a ground voltage, and
wherein the switching device comprises first, second and third terminals, the first terminal of the switching device being coupled to the first terminal of the capacitive device, the second terminal of the switching device being coupled to the floating diffusion, and the third terminal of the switching device being coupled to the first enable signal and the second enable signal, the switching device being responsive to the first enable signal to transfer the first charge on the capacitive device to the floating diffusion, and responsive to the second enable signal to transfer the second charge on the capacitive device to the floating diffusion.

16. The image sensor of claim 15, further comprising:
at least one single-photon avalanche diode (SPAD), each SPAD being responsive to during an active shutter signal to generate an output signal based on detecting the one or more photons that are incident on the SPAD, the one or more photons being reflected from an object; and
a logic circuit coupled to the output signal of the at least one SPAD, the logic circuit to generate the first enable signal, the first enable signal being active in response to a beginning of the active shutter signal and being inactive in response to the output signal of the at least one SPAD.

17. The image sensor of claim 15, wherein the output circuit outputs the first voltage and the second voltage through a same signal path.

18. The image sensor of claim 17, wherein the floating diffusion comprises a first floating diffusion,
the at least one pixel further comprising a storage floating diffusion between the second terminal of the capacitive device and the first floating diffusion.

19. The image sensor of claim 14, wherein the output circuit comprises a first signal path to output the first voltage and a second signal path to output the second voltage.

20. The image sensor of claim 19, wherein the switching device comprises a first transistor and a second transistor, the floating diffusion comprises a first floating diffusion and a second floating diffusion, and the capacitive device comprises a first pinned photodiode (PPD) and a second PPD, and
wherein the first transistor is responsive to the first enable signal to transfer the first charge on the first PPD to the first floating diffusion, and
wherein the second transistor comprises first, second and third terminals, the first terminal of the second transistor being coupled to the first terminal of the second PPD, the second terminal of the second transistor being coupled to the second floating diffusion, and the third terminal of the second transistor being coupled to the second enable signal, the second transistor being responsive to the second enable signal to transfer the second charge on the capacitive device to the second floating diffusion.

* * * * *